(12) United States Patent
Toshima et al.

(10) Patent No.: US 6,860,710 B1
(45) Date of Patent: Mar. 1, 2005

(54) LIFTING MECHANISM FOR INTEGRATED CIRCUIT FABRICATION SYSTEMS

(75) Inventors: Masato Toshima, Sunnyvale, CA (US); Linh X. Can, San Jose, CA (US); Jay C. Cho, Pleasanton, CA (US)

(73) Assignee: Novellus Systems, Inc., San Jose, CA (US)

(*) Notice: Subject to any disclaimer, the term of this patent is extended or adjusted under 35 U.S.C. 154(b) by 0 days.

(21) Appl. No.: 10/404,241

(22) Filed: Apr. 1, 2003

Related U.S. Application Data
(60) Provisional application No. 60/407,377, filed on Aug. 30, 2002.

(51) Int. Cl.[7] .............................................. B65G 49/07
(52) U.S. Cl. ..................................................... 414/939
(58) Field of Search ................................ 118/729, 730, 118/733, 719, 669; 438/691; 414/626, 939, 937, 940

(56) References Cited

U.S. PATENT DOCUMENTS

| | | | | |
|---|---|---|---|---|
| 4,226,208 A | * | 10/1980 | Nishida et al. ............. | 118/706 |
| 5,370,745 A | * | 12/1994 | Litteral ....................... | 118/669 |
| 5,407,449 A | * | 4/1995 | Zinger ........................ | 29/25.01 |
| 5,498,294 A | * | 3/1996 | Matsushita et al. ............ | 134/6 |
| 6,059,517 A | * | 5/2000 | Begin ........................ | 414/744.6 |
| 6,135,051 A | * | 10/2000 | Begin ......................... | 118/669 |
| 6,149,367 A | * | 11/2000 | Begin ..................... | 414/331.18 |
| 6,395,094 B1 | * | 5/2002 | Tanaka et al. .............. | 118/719 |
| 6,460,424 B1 | * | 10/2002 | Dubas et al. ................ | 74/22 R |
| 6,573,198 B2 | * | 6/2003 | Boonstra et al. ............ | 438/795 |
| 6,607,602 B1 | * | 8/2003 | Granneman et al. ........ | 118/719 |
| 6,663,332 B1 | * | 12/2003 | Sluijk et al. ................ | 414/160 |

* cited by examiner

Primary Examiner—Richard Ridley
(74) Attorney, Agent, or Firm—Okamoto & Benedicto LLP

(57) ABSTRACT

In one embodiment, a lifting apparatus in an integrated circuit fabrication system includes a sliding mechanism supporting a rotatable assembly and an actuator configured to vertically move the sliding mechanism. Among other advantages, the apparatus allows the rotatable assembly to be lifted and then rotated to allow access to interior components, for example. In one embodiment, the rotatable assembly comprises a lid of a process chamber.

7 Claims, 10 Drawing Sheets

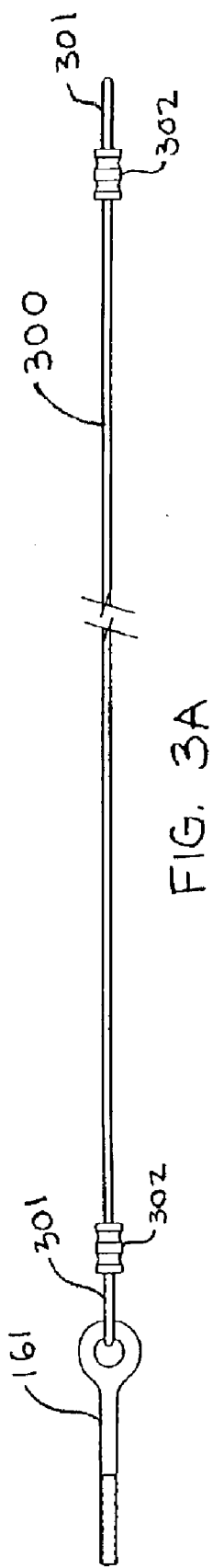
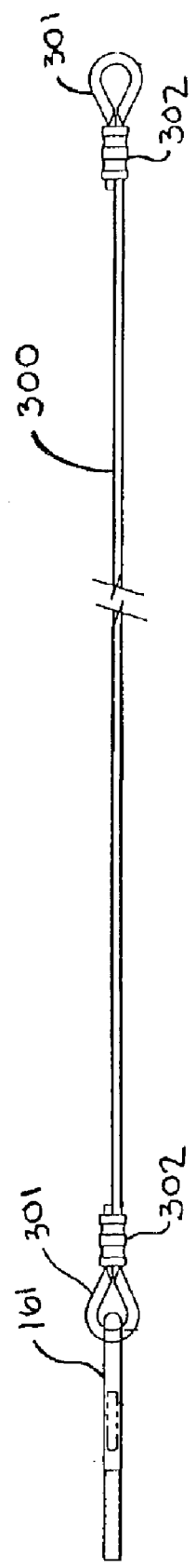

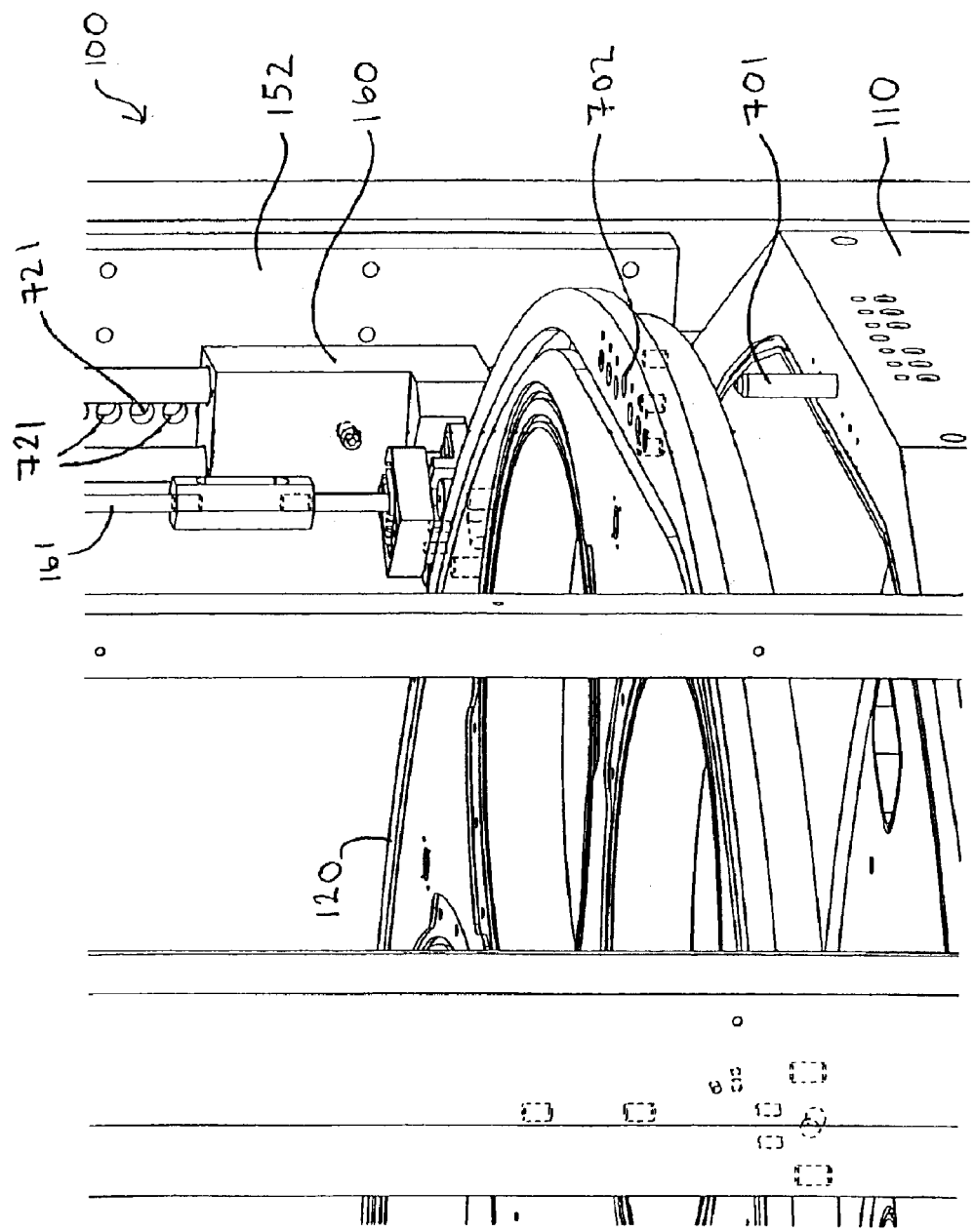

LIFTING MECHANISM FOR INTEGRATED CIRCUIT FABRICATION SYSTEMS

CROSS-REFERENCE TO RELATED APPLICATION

This application claims the benefit of U.S. Provisional Application No. 60/407,377, entitled, "LIFTING MECHANISM FOR INTEGRATED CIRCUIT FABRICATION SYSTEMS", filed on Aug. 30, 2002, by Masato Toshima, Linh X. Can, and Jay C. Cho, incorporated herein by reference in its entirety.

BACKGROUND OF THE INVENTION

1. Field of the Invention

The present invention relates generally to lifting mechanisms, and more particularly but not exclusively to lifting mechanisms employed in integrated circuit fabrication systems.

2. Description of the Background Art

Integrated circuits are typically fabricated in specially-built manufacturing facilities. An integrated circuit manufacturing facility may include a clean room and provisions for pumps, gas supply lines, and other fabrication support items. Because a manufacturing facility is relatively expensive to build, it is advantageous to efficiently utilize every available space in a manufacturing facility. To this end, systems for fabricating integrated circuits, which are also referred to as "tools", are designed with compact dimensions so that they can be placed close to one another.

Like other pieces of machinery, a tool needs to be serviced from time to time. The compact dimensions of a tool, together with a crowded manufacturing facility, make some components of a tool difficult to access for servicing. This access problem is exacerbated by the fact that some tools have heavy, unwieldy, and dangerous components.

From the foregoing, a mechanism for improving access to components of a tool is generally desirable.

SUMMARY

In one embodiment, a lifting apparatus in an integrated circuit fabrication system includes a sliding mechanism supporting a rotatable assembly and an actuator configured to vertically move the sliding mechanism. Among other advantages, the apparatus allows the rotatable assembly to be lifted and then rotated to allow access to interior components, for example. In one embodiment, the rotatable assembly comprises a lid of a process chamber.

These and other features of the present invention will be readily apparent to persons of ordinary skill in the art upon reading the entirety of this disclosure, which includes the accompanying drawings and claims.

DESCRIPTION OF THE DRAWINGS

FIGS. 3A and 3B show two views of a wire rope in accordance with an embodiment of the present invention.

FIG. 7 shows another view of a tool in accordance with an embodiment of the present invention.

The use of the same reference label in different drawings indicates the same or like components. Drawings are not necessarily to scale unless otherwise noted.

DETAILED DESCRIPTION

In the present disclosure, numerous specific details are provided such as examples of apparatus, components, and methods to provide a thorough understanding of embodiments of the invention. Persons of ordinary skill in the art will recognize, however, that the invention can be practiced without one or more of the specific details. In other instances, well-known details are not shown or described to avoid obscuring aspects of the invention. Additionally, although embodiments of the invention are described using an integrated circuit fabrication system as an example, it should be understood that the invention may be employed for lifting objects in general.

Figure 1:
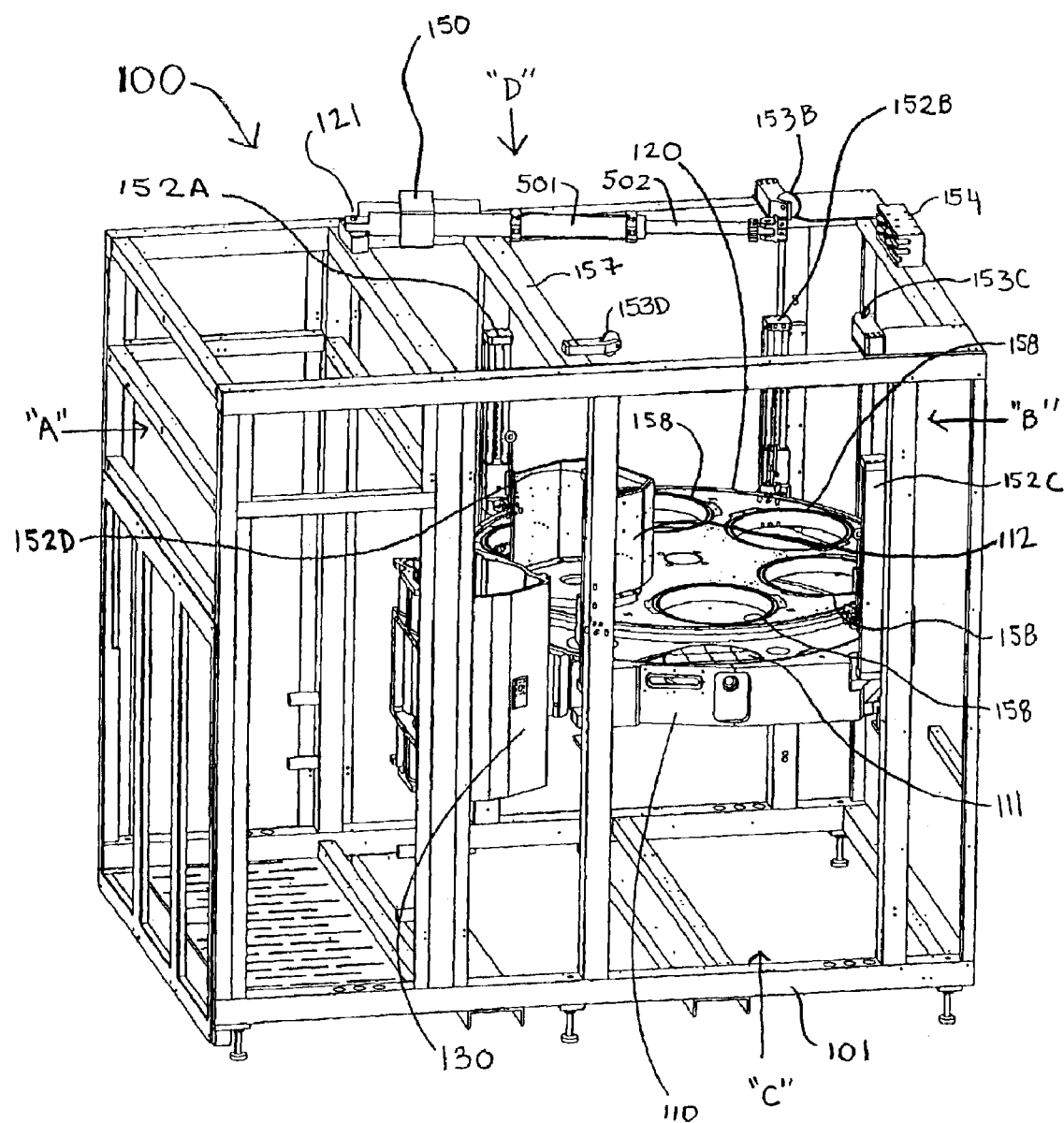
FIG. 1 shows a perspective view of a tool in accordance with an embodiment of the present invention.

Referring now to FIG. 1, there is shown a perspective view of a tool 100 in accordance with an embodiment of the present invention. Tool 100 may be a system for fabricating integrated circuits, such as an ashing, chemical vapor deposition, physical vapor deposition, or etching system, for example.

Tool 100 includes a frame assembly 101 to which components or assemblies (i.e., collection of components) may be attached. As shown in FIG. 1, a process chamber 110 and a load lock 130 are attached to frame assembly 101. A lid 120 covers the top portion of process chamber 110 during normal operation. As a top plate of a process chamber, lid 120 may be relatively heavy and may weigh more than 400 pounds (e.g., 560 pounds). Note that some components of tool 100 are not shown or fully depicted in FIG. 1 for clarity of illustration. For example, load lock 130, lid 120, and a module 112 are only partially depicted in FIG. 1. Additionally, other components of tool 100 including electrical panels, gas boxes, and the like are not depicted to enable full viewing of components relevant to the present invention.

In one embodiment, tool 100 has four sides labeled in FIG. 1 as side "A", side "B", side "C", and side "D". Side "A" is the front or load lock 130 side of tool 100, side "B" is the side opposite side "A", side "C" is the side facing the page of FIG. 1, and side "D" is the side opposite side "C". During normal operation, one or more wafers are transferred from a cassette (not shown) in front of tool 100 and placed in load lock 130. From load lock 130, a wafer is transferred to process chamber 110 where the wafer is processed. From process chamber 110, the wafer is transferred back to load lock 130 and then onto the cassette where it originally came from. Note that tool 100 may also have more than one load lock 130. For example, one load lock 130 may be designated for wafers going into process chamber 110 while another load lock 130 may be designated for wafers coming out of process chamber 110.

In one embodiment, process chamber 110 is a multi-wafer ashing chamber. However, process chamber 110 may also be any type of chamber used for semiconductor processing. Process chamber 110 may include one or more pedestals 111 for supporting or heating a wafer. Lid 120 may be an assembly of one or more components, such as modules 112. A module 112 may be an RF matching network placed over each pedestal 111, for example. Note that only one partially depicted module 112 is shown in FIG. 1 for clarity of illustration. Furthermore, lid 120 is depicted as raised over process chamber 110 to show a pedestal 111. During normal operation, lid 120 covers the top portion of process chamber 110. Also, each hole 158 on top of lid 120 may be populated by a module 112 or other components.

To facilitate access to components of tool 100 that are on lid 120, tool 100 includes a lifting mechanism comprising an actuator 150 and slider assemblies 152 (i.e., 152A, 152B, . . . ). The lifting mechanism allows lid 120 to be raised and then rotated to allow access to interior components. For example, the lifting mechanism may be employed to raise lid 120 so that a module 112 facing side "A" of tool 100 may be rotated to face side "C". Once on side "C", the module 112 can then be readily accessed. Note that the module 112 may have dangerous voltages that need to be probed or may have small components that need to be replaced. Thus, the capability to move a module 112 where it can be readily accessed not only improves the serviceability of tool 100 in general, but also makes it safer to work on. Note that a module 112 may have cables or other interconnections that may need to be made longer or have the capability to be disconnected in order to rotate the module 112. The lifting mechanism is now further described with reference to FIG. 2.

Figure 2:
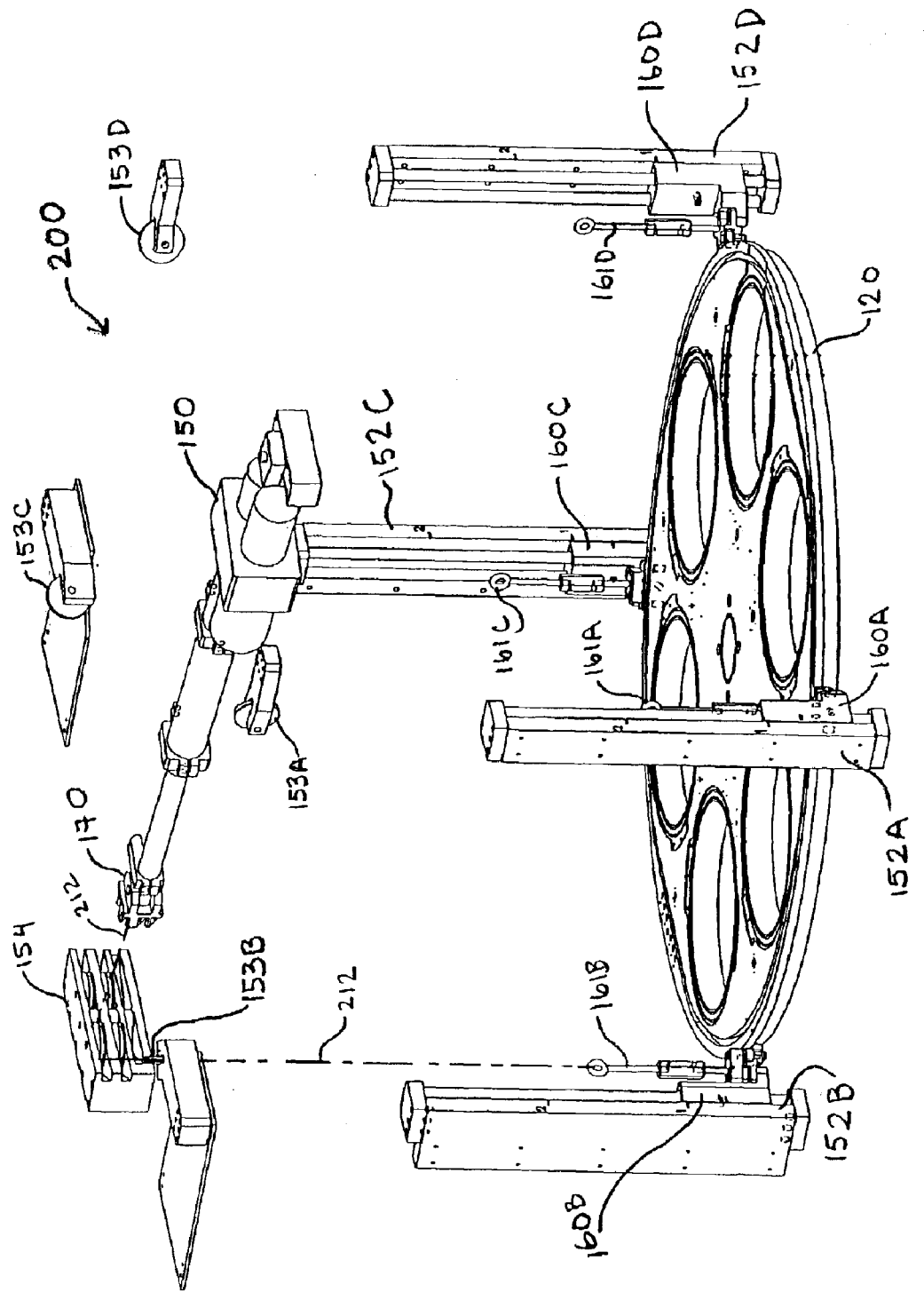
FIG. 2 shows a lifting mechanism in accordance with an embodiment of the present invention.

FIG. 2 shows a lifting mechanism 200 in accordance with an embodiment of the present invention. Lifting mechanism 200 is depicted in FIG. 2 without the other components of tool 100 for clarity of illustration. Lifting mechanism 200 comprises actuator 150, slider assemblies 152, and a pulley network comprising pulleys 153 (i.e., 153A, 153B, . . . ) and a pulley junction 154 (see also FIG. 1). In one embodiment, each slider assembly 152 includes a slider 160 (i.e., 160A, 160B, . . . ) that is fixedly attached to an eyebolt 161 (i.e., 161A, 161B, . . . ). Each eyebolt 161 may be coupled to a bracket 170 of actuator 150 via a wire rope 300 (see FIGS. 3A and 3B) that goes from an eyebolt 161, to a pulley 153, to a pulley of junction 154, and then to bracket 170. For example, a wire rope represented by a dashed line 212 may go from eyebolt 161B, to pulley 153B, to a pulley of junction 154, and then to bracket 170 as shown in FIG. 2. Because lid 120 is supported by sliders 160, commanding actuator 150 to pull-in bracket 170 will raise lid 120. Conversely, commanding actuator 150 to push-out bracket 170 will lower lid 120. Actuator 150 may be commanded by activating an electrical switch to turn-on a motor of actuator 150, for example.

FIGS. 3A and 3B show two views of a wire rope 300 in accordance with an embodiment of the present invention. In one embodiment, a wire rope 300 is a 7×19 strand stainless steel wire rope. A wire rope 300 may be used to couple an eyebolt 161 to bracket 170. In one embodiment, a wire rope 300 includes a wire rope thimble 301 on both ends. One thimble 301 may be attached to an eyebolt 161, while the other thimble 301 may be attached to bracket 170. A thimble 301 may be crimped onto a wire rope 300 using a sleeve 302.

Figure 4:
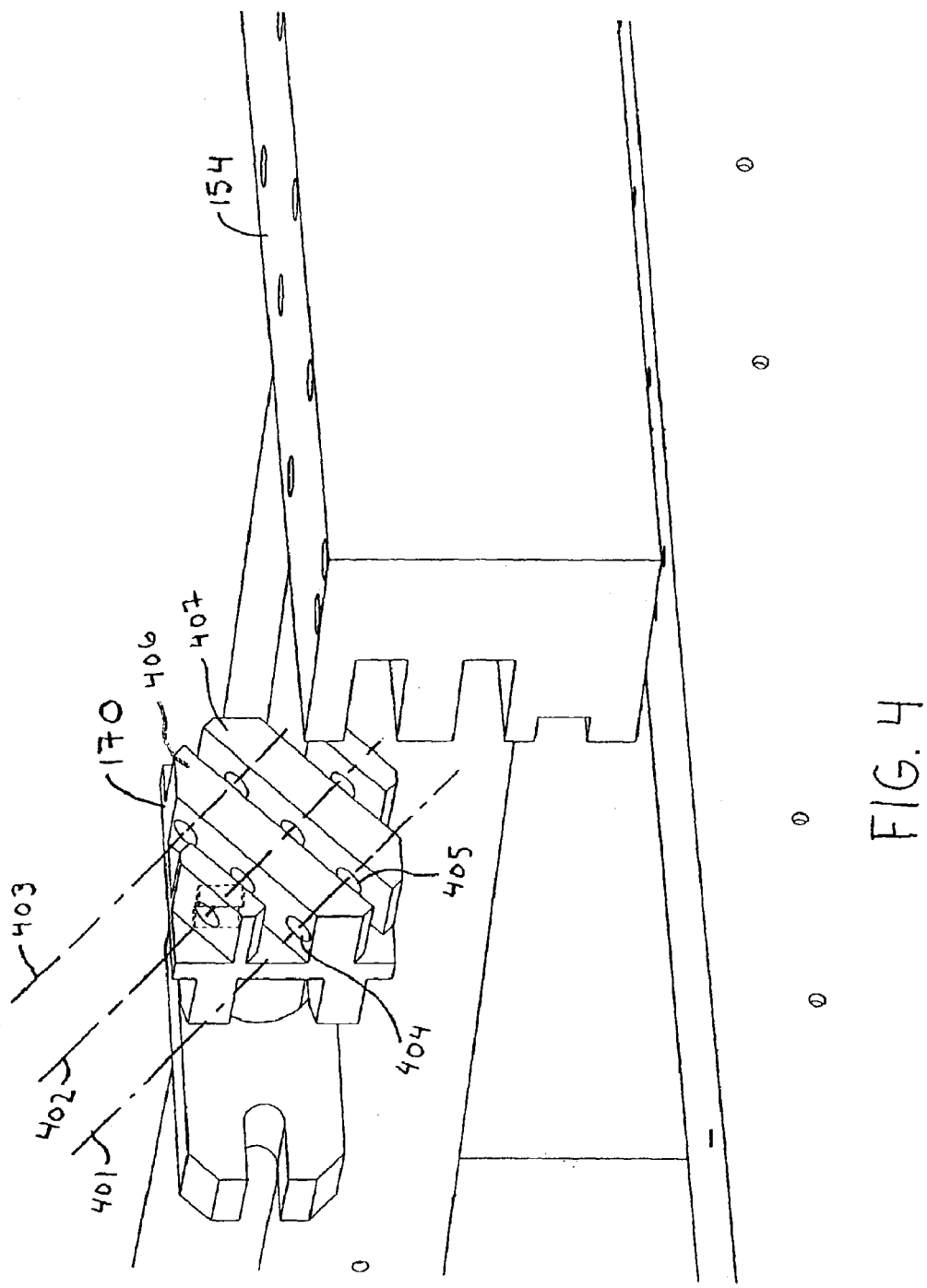
FIG. 4 shows a bracket in accordance with an embodiment of the present invention.

FIG. 4 shows a bracket 170 in accordance with an embodiment of the present invention. In on embodiment, bracket 170 includes several holes through which pins may be inserted. For example, to secure a thimble 301 of a wire rope 300 between bracket pieces 406 and 407, a pin may be inserted through holes 404 and 405 along a direction represented by a dashed line 401. Similarly, additional thimbles 301 of wire ropes 300 may be secured by inserting pins through other holes of bracket 170 along directions represented by dashed lines 402 and 403.

Figure 5:
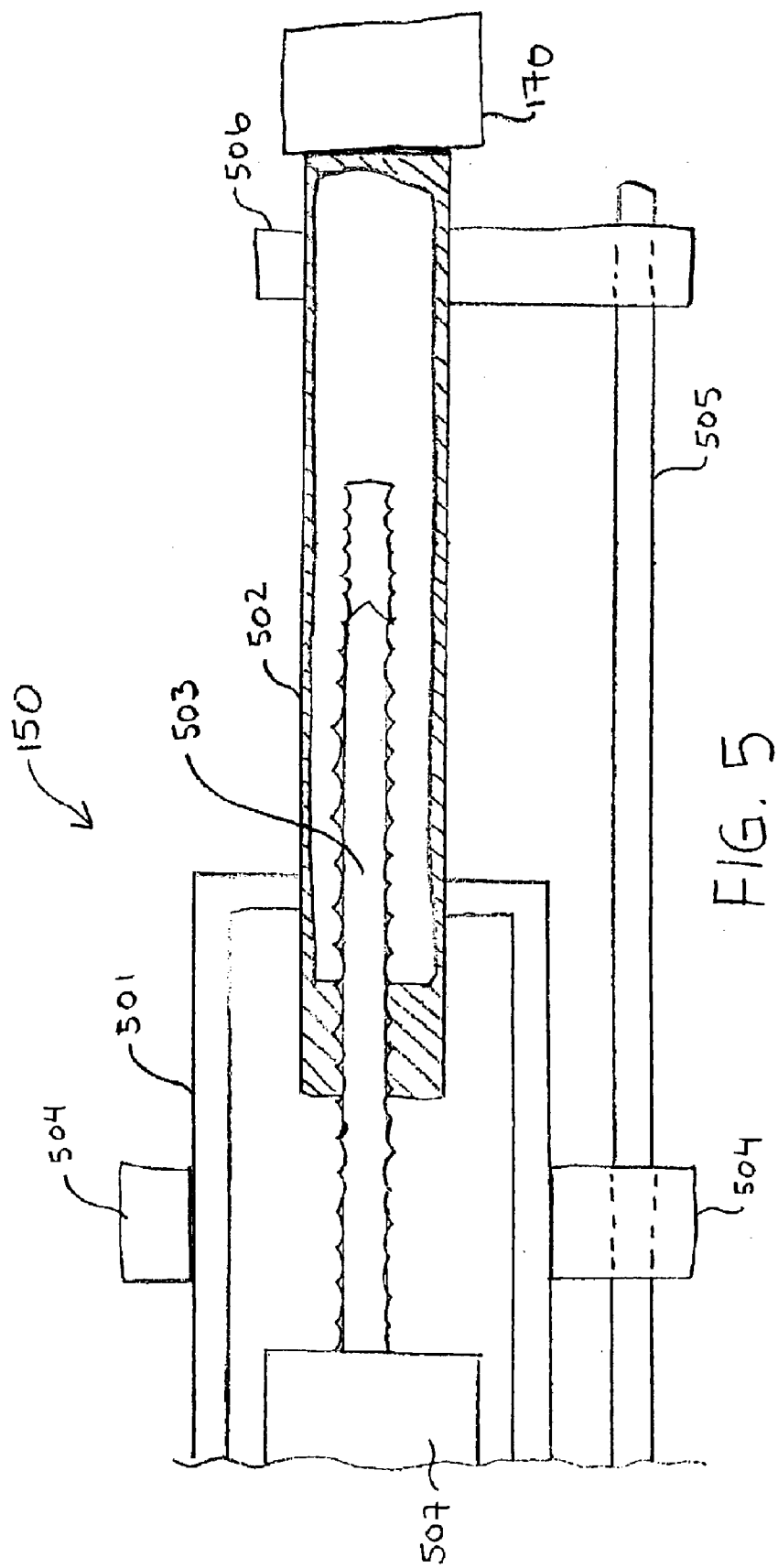
FIG. 5 schematically shows an actuator in accordance with an embodiment of the present invention.

FIG. 5 schematically shows an actuator 150 in accordance with an embodiment of the present invention. Actuator 150 may be a linear actuator of the type commercially available from the Duff-Norton division of the Columbus McKinnon Corporation of Amherst, N.Y., for example. In one embodiment where a lid 120 weighs about 560 pounds, actuator 150 is rated for about 2000 pounds. Note that as used in the present disclosure, the term "actuator" generally refers to a mechanism for moving an object. As shown in FIG. 5, actuator 150 may comprise an inner tube 502, an outer tube 501, blocks 504 and 506, anti-rotation rod 505, motor 507, and bracket 170. Inner tube 502 may slide in and out of outer tube 501. A lead screw 503 may be coupled to motor 507 and engage the threads of inner tube 502. Motor 507 rotates lead screw 503 to pull or push bracket 170, which is fixedly attached to inner tube 502. To prevent inner tube 502 from twisting while lead screw 503 rotates, an anti-rotation shaft 505 goes through a hole in blocks 504 and 506. Blocks 504 and 506 may be clamped onto outer tube 501 and inner tube 502, respectively.

As shown in FIG. 1, actuator 150 may pivot at a point 121. This advantageously allows actuator 150 to move about to compensate for differing wire rope lengths as lid 120 is raised or lowered by pulling-in or pushing-out bracket 170. A block (not shown), which may be of a plastic material, may be placed on a frame portion 157 and generally under actuator 150 to provide additional vertical support.

Figure 6:
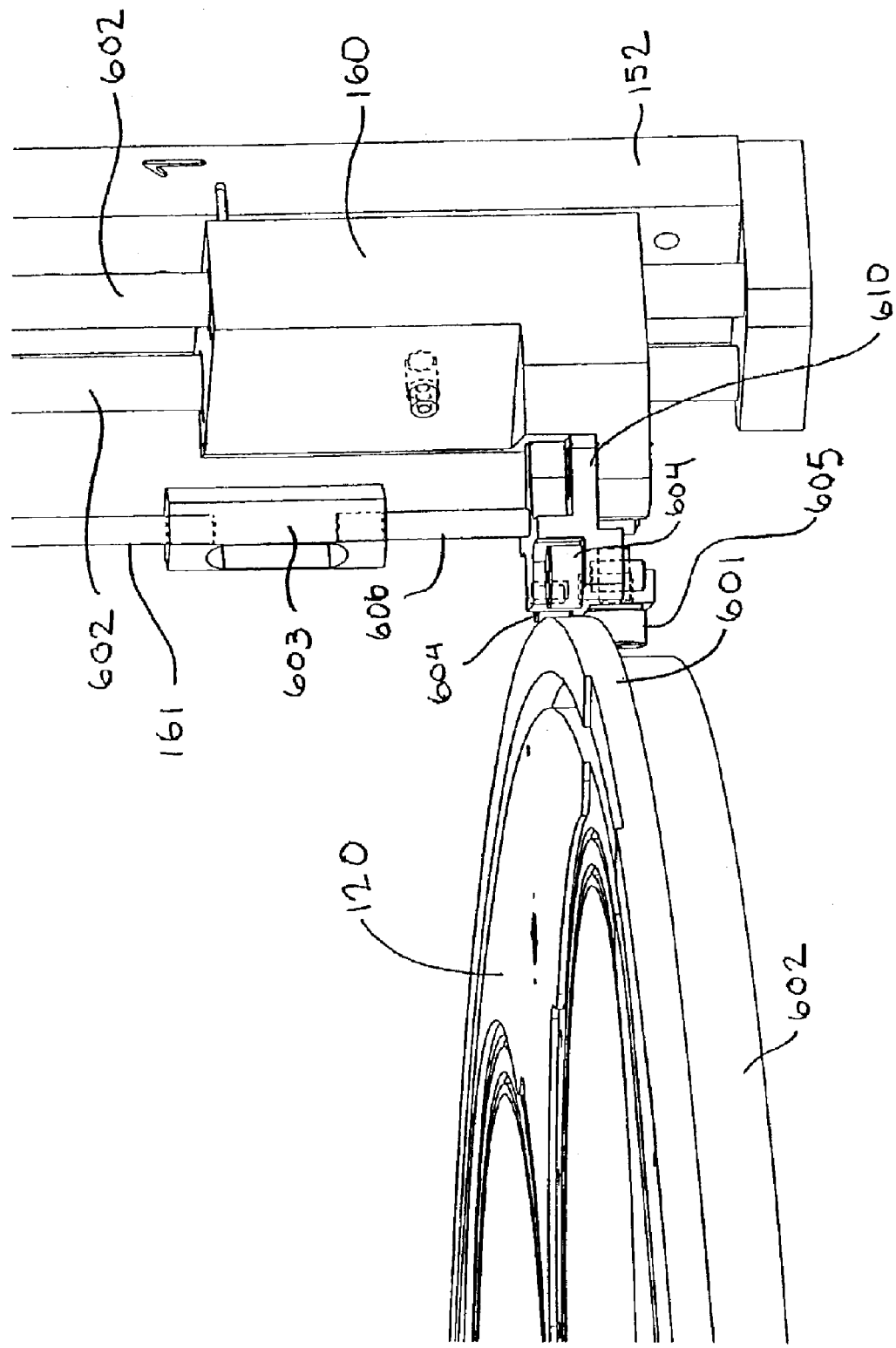
FIG. 6 shows a slider assembly in accordance with an embodiment of the present invention.

Referring now to FIG. 6, there is shown a slider assembly 152 in accordance with an embodiment of the present invention. Slider assembly 152 includes one or more shafts 602 on which a slider 160 rides. Because most of the force on shafts 602 will be vertically directed, a slider 160 does not necessarily require bearings for contacting shafts 602. In one embodiment, the holes (e.g., see hole 801 of FIG. 8A) of a slider 160 through which shafts 602 slide have plastic bushings to reduce friction between shafts 602 and slider 160.

As shown in FIG. 6, slider 160 may also have a support piece 610 that includes one or more rollers 604 and a roller 605. Rollers 604 limit horizontal movement of lid 120 while allowing lid 120 to rotate. Roller 605 supports lid 120 and also allows it to rotate. Roller 605 may contact the bottom surface of a lip 601 of lid 120. Lid 120 may also have a main body 602 with an outer diameter that is smaller than that of lip 601. In one embodiment, the outer diameter of lip 601 is about 53.9 inches, while that of body 602 is about 52.76 inches. During normal operation, the bottom surface of body 602 contacts a top portion of process chamber 110 (see FIG. 1). To maintain a vacuum seal in a process chamber 110, an O-ring (not shown) may be placed between body 602 and process chamber 110. Vacuum generated inside process chamber 110 pulls lid 120 down, thereby helping make a vacuum seal.

Still referring to FIG. 6, a turn-buckle 603 may be used to couple an eyebolt 161 to a rod 606 that is fixedly attached to support piece 610. Pulling-up eyebolt 161 thus raises lid 120, allowing it to be rotated.

FIG. 7 shows another view of tool 100. As shown in FIG. 7, a locating pin 701 may be employed to facilitate location of lid 120 relative to process chamber 110. To lower lid 120 on process chamber 110, lid 120 is rotated such that locating pin 701 is directly below hole 702. This allows locating pin 701 to go through hole 702 as lid 120 is lowered onto process chamber 110. Because of locating pin 701, lid 120 cannot be lowered to process chamber 110 unless lid 120 is rotated to its proper operating location. Locating pin 701 thus advantageously prevents improper placement of lid 120.

Still referring to FIG. 7, a slider assembly 152 may include several holes 721 that may be used in conjunction with a pin to arrest the movement of slider 160 in the event of a failure, such as when a wire rope 300 attached to an eyebolt 161 breaks, for example. This aspect of the present invention is now described with reference to FIGS. 8A and 8B.

Figure 8A:
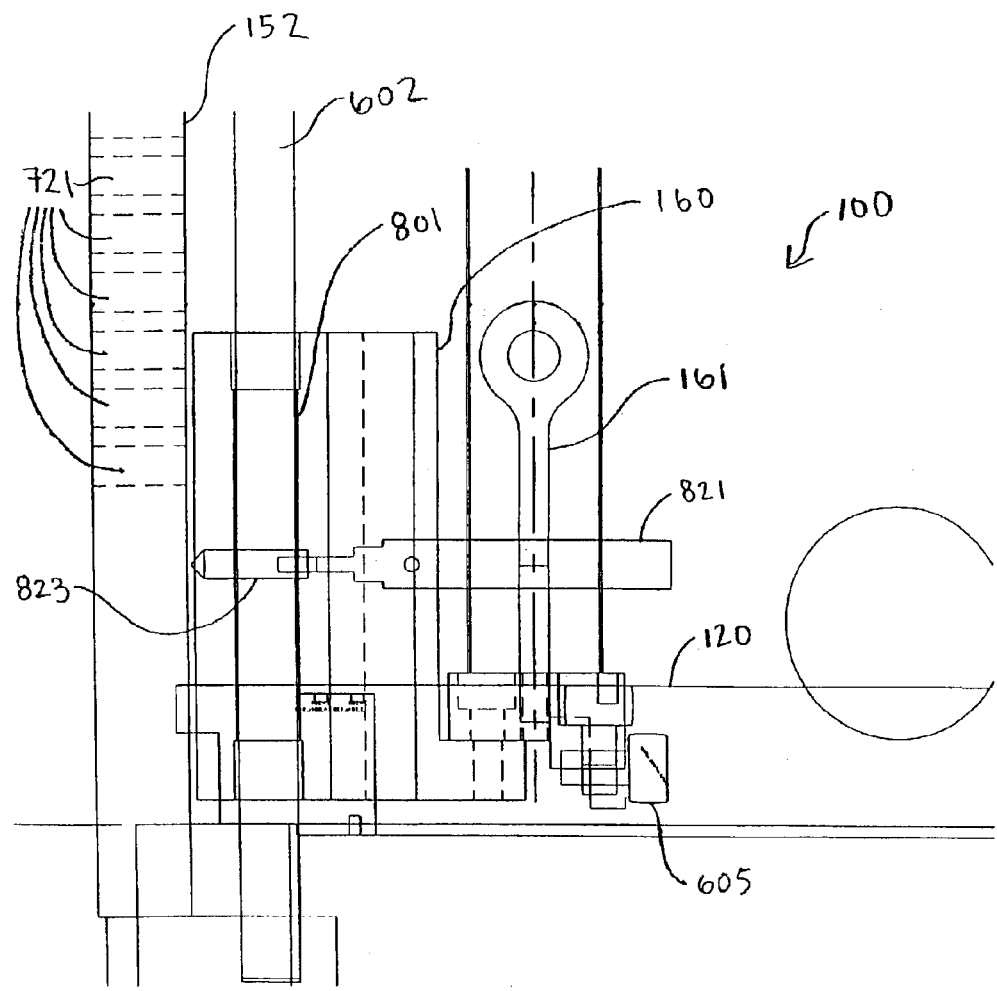
FIG. 8A schematically shows an x-ray view of a section of a tool in accordance with an embodiment of the present invention.

FIG. 8A shows an x-ray view of a section of tool 100. As shown in FIG. 8A, an arresting pin 823 may be coupled to a pin driver 821. To raise slider 160 (and hence lid 120), arresting pin 823 may be pulled by pin driver 821 such that arresting pin 823 does not engage any hole 721. After slider 160 is raised, driver 821 may push arresting pin 823 to go through a hole 721. This advantageously provides a safety mechanism to prevent lid 120 from accidentally falling down while in a raised position.

Figure 8B:
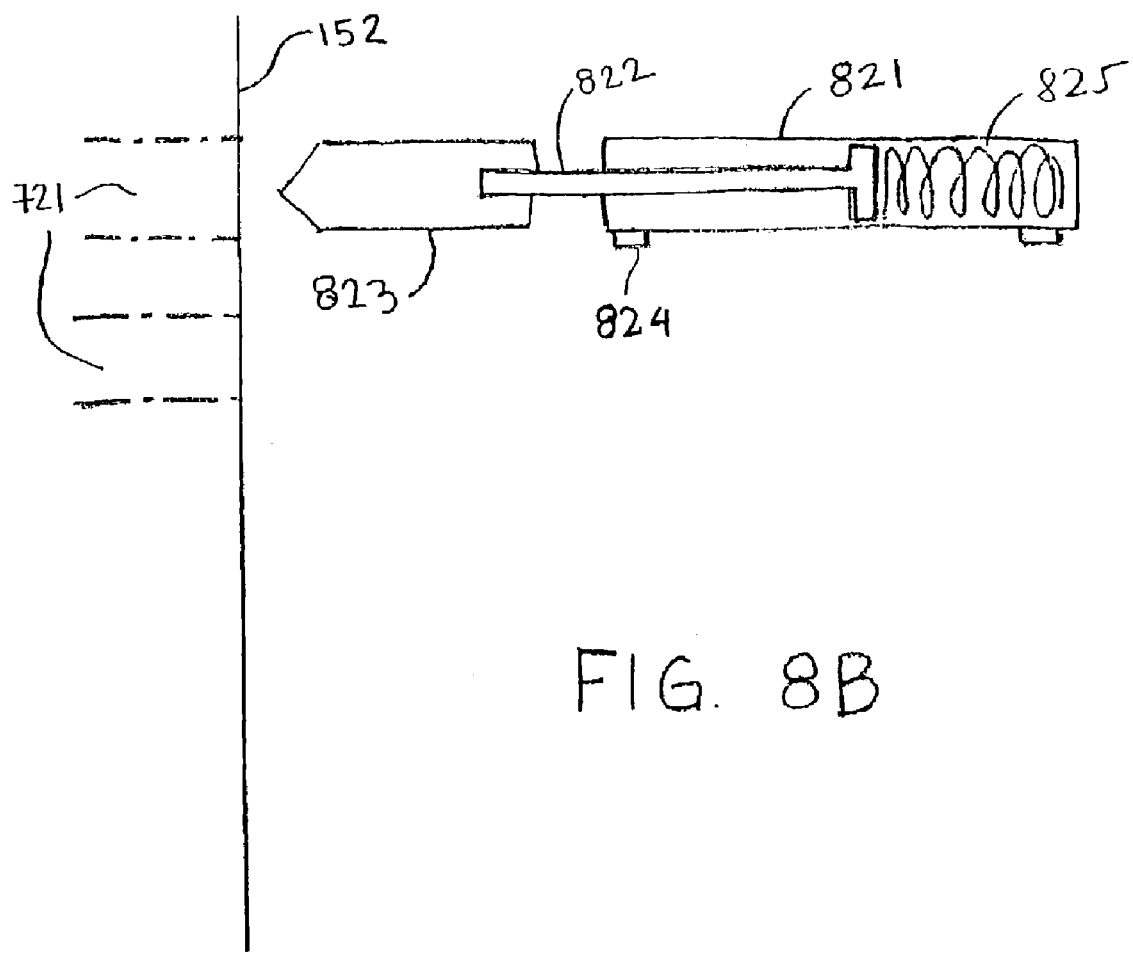
FIG. 8B schematically shows a pin driver in accordance with an embodiment of the present invention.

FIG. 8B schematically shows a pin driver 821 in accordance with an embodiment of the present invention. Driver 821 may be pneumatically controllable, such as an air cylinder with a plunger 822 that is coupled to arresting pin 823. Driver 821 may comprise an air cylinder of the type commercially available from the Bimba Manufacturing Company, for example. When air is supplied to an inlet 824, plunger 822 is pushed back to retract arresting pin 823 away from holes 721. When air supplied to inlet 824 is removed, spring 825 pushes out plunger 822, thereby pushing arresting pin 823 to engage a hole 721. Arresting pin 823 is preferably tapered to facilitate insertion to a hole 721. Note that if arresting pin 823 is not properly centered to a hole 721, spring 825 pushes arresting pin 823 such that it will engage a hole 721 in the event of a failure so long as air is not supplied to inlet 824.

Figure 9:
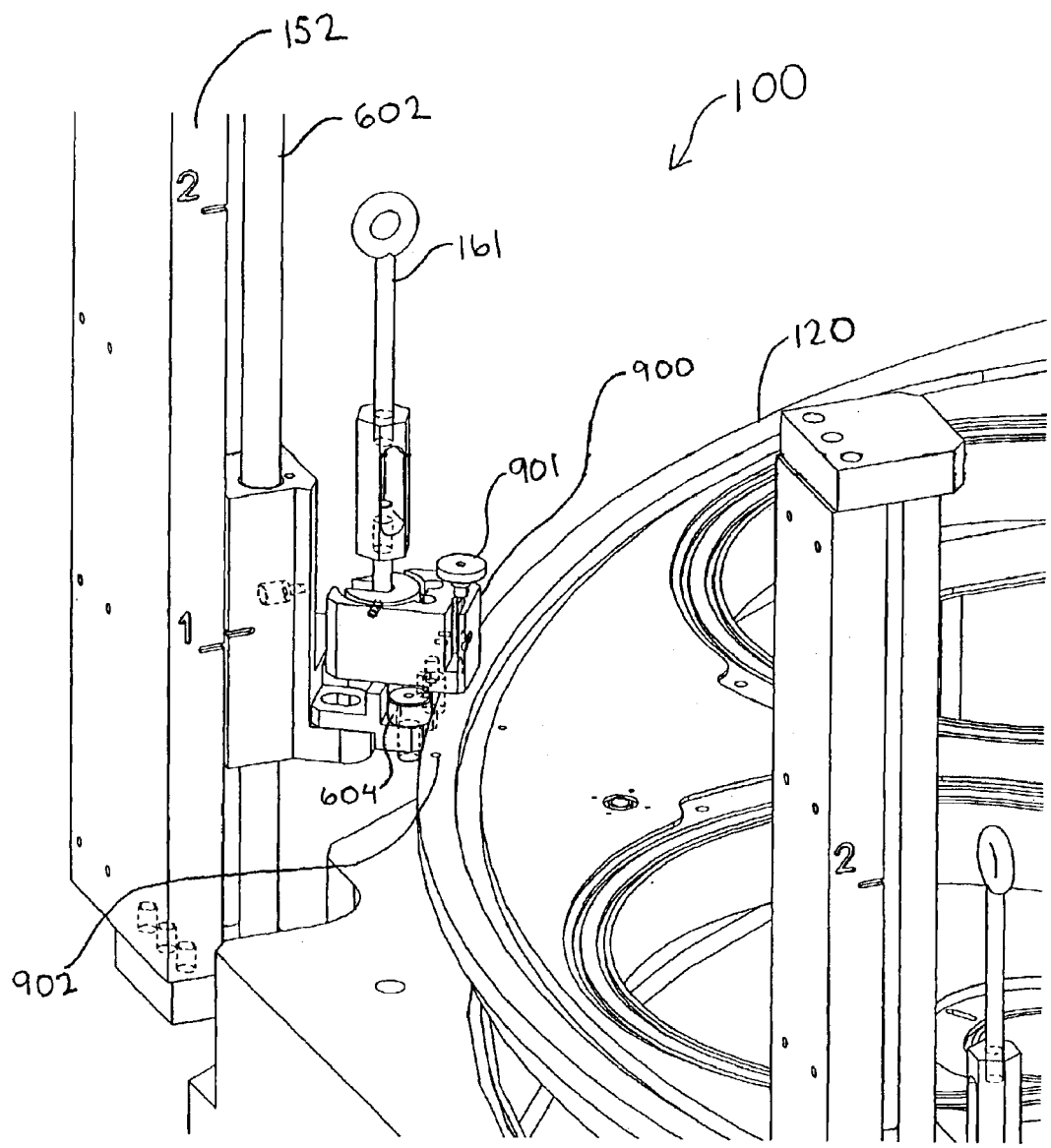
FIG. 9 shows another view of a tool in accordance with an embodiment of the present invention.

FIG. 9 shows another view of tool 100. As shown in FIG. 9, a slider assembly 152 may also include a sensor block 900. Sensor block 900 advantageously provides another level of protection to prevent vertical movement of lid 120 when it is not in the correct position. Sensor block 900 may comprise a detent pin 901 and sensor electronics (not shown) for detecting whether pin 901 protrudes out of sensor block 900 and engages a hole 902 in lid 120. Pin 901 may be manually pulled out to allow rotation of lid 120. Pin 901 may include a spring to push pin 901 into hole 902 when lid 120 is in the proper rotational orientation (i.e., correctly positioned) for movement or normal operation. When pin 901 is in hole 902, the sensor electronics closes an interlock to allow lid 120 to be raised or lowered by actuator 150. When pin 901 is not in hole 902, this indicates that lid 120 is rotated out of position and may be dangerous to move vertically. The sensor electronics detects when pin 901 is not in hole 902, and accordingly opens an interlock to disable raising or lowering of lid 120.

While specific embodiments of the present invention have been provided, it is to be understood that these embodiments are for illustration purposes and not limiting. Many additional embodiments will be apparent to persons of ordinary skill in the art reading this disclosure. Thus, the present invention is limited only by the following claims.

What is claimed is:

1. A lifting apparatus in an integrated circuit fabrication system, the apparatus comprising:
   a sliding mechanism supporting a rotatable assembly, wherein the rotatable assembly comprises a lid of a process chamber; and
   an actuator configured to vertically move the sliding mechanism, wherein the actuator is coupled to the sliding mechanism via a wire rope.

2. The apparatus of claim 1 wherein the rotatable assembly includes electrical components of an integrated circuit fabrication system.

3. The apparatus of claim 1 further comprising a locating pin for aligning the lid with the process chamber.

4. A lifting apparatus comprising:
   lifting means for lifting an assembly of an integrated circuit fabrication system, the lifting means comprising a vertically oriented sliding mechanism coupled to a linear actuator, wherein the sliding mechanism is coupled to the linear actuator via a wire rope; and
   rotating means for rotating the assembly to allow access to a component on the assembly.

5. A lifting apparatus in an integrated circuit fabrication system, the apparatus comprising:
   a sliding mechanism supporting a rotatable assembly, wherein the rotatable assembly comprises a lid of a process chamber;
   an actuator configured to vertically move the sliding mechanism; and
   a locating pin for aligning the lid with the process chamber.

6. The apparatus of claim 5 wherein the actuator is coupled to the sliding mechanism via a wire rope.

7. The apparatus of claim 5 wherein the rotatable assembly includes electrical components of an integrated circuit fabrication system.

* * * * *